Oct. 8, 1963 J. L. SMITH, JR 3,106,681

R.F. AMPLIFIER AUTOMATIC FREQUENCY TUNING

Filed March 6, 1961 2 Sheets-Sheet 1

INVENTOR.
JULIUS L. SMITH JR.
BY
Woody and Kintzinger
ATTORNEYS

INVENTOR.
JULIUS L. SMITH JR.
BY Moody and Kintzinger
ATTORNEYS

United States Patent Office 3,106,681

Patented Oct. 8, 1963

3,106,681

R.F. AMPLIFIER AUTOMATIC FREQUENCY TUNING

Julius L. Smith, Jr., Richardson, Tex., assignor to Collins Radio Company, Cedar Rapids, Iowa, a corporation of Iowa Filed Mar. 6, 1961, Ser. No. 93,491
3 Claims. (Cl. 325—421)

Figure 1:
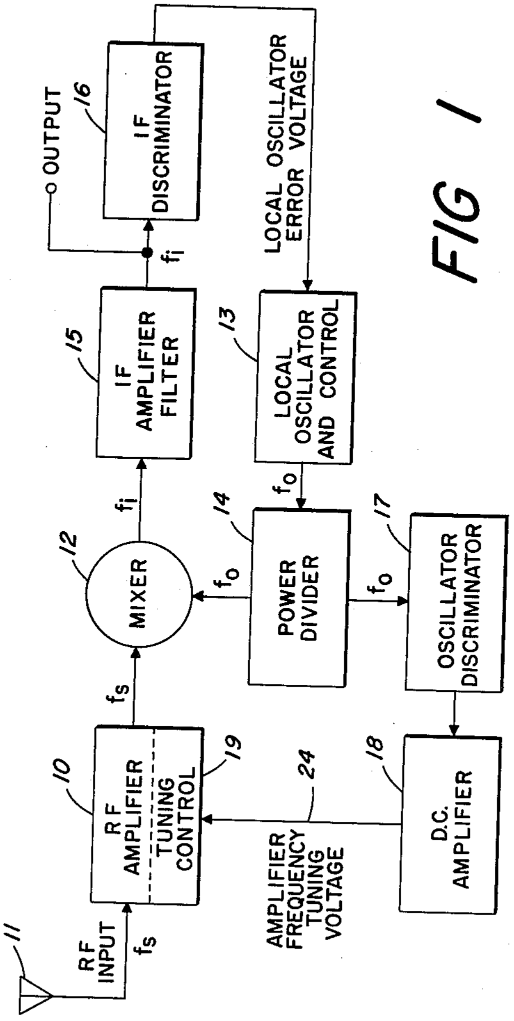

This invention relates in general to tuning apparatus and in particular to a system for tuning an early stage of a radiant energy receiving system in response to changes from a reference frequency of a local oscillator.

A widely accepted design approach for R.F. amplifiers normally provides a sufficiently broad frequency band to accommodate frequency drift of the incoming carrier signal. Other amplifiers may have a wide enough frequency band pass to accommodate the inteligence to be received but, by nature, are too narrow to allow for any drift of the incoming signal. In any event, greater R.F. signal receiving efficiencies would be obtained if a tuned narrow frequency band could be employed with automatic R.F. frequency tuning. This would be the case especially when receiving high R.F. signals in the ranges particularly suitable for voltage-tuned backward wave amplifiers. Backward wave amplifiers may be electronically tuned, and such amplifiers are generally narrow band devices which result in efficient operation.

It is therefore, a principal object of this invention to automatically tune a radio frequency amplifier to follow frequency drift of the input R.F. signal.

Another object is to provide automatic R.F. amplifier tuning in a superheterodyne radio system which also has conventional automatic frequency control.

A furthe robject of this invention is to automatically control a local oscillator and in turn to automatically tune the R.F. amplifier as a function of the local oscillator frequency.

Features of this invention useful in accomplishing the above objects include the provision of an R.F. amplifier, a local oscillator, a signal mixer, and means controlling said local oscillator such as an I.F. discriminator having an S curve response and developing a D.C. voltage whenever the I.F. changes from the regulated frequency. Other features are an oscillator discriminator having an S curve response and developing a D.C. voltage output whenever the frequency signal of the local oscillator varies from a reference frequency, and a tuning control for the R.F. amplifier which is tuning controlled by the D.C. voltage signal from the oscillator discriminator.

A specific embodiment representing what is presently regarded as the best mode of carrying out the invention is illustrated in the accompanying drawings.

Figure 2:
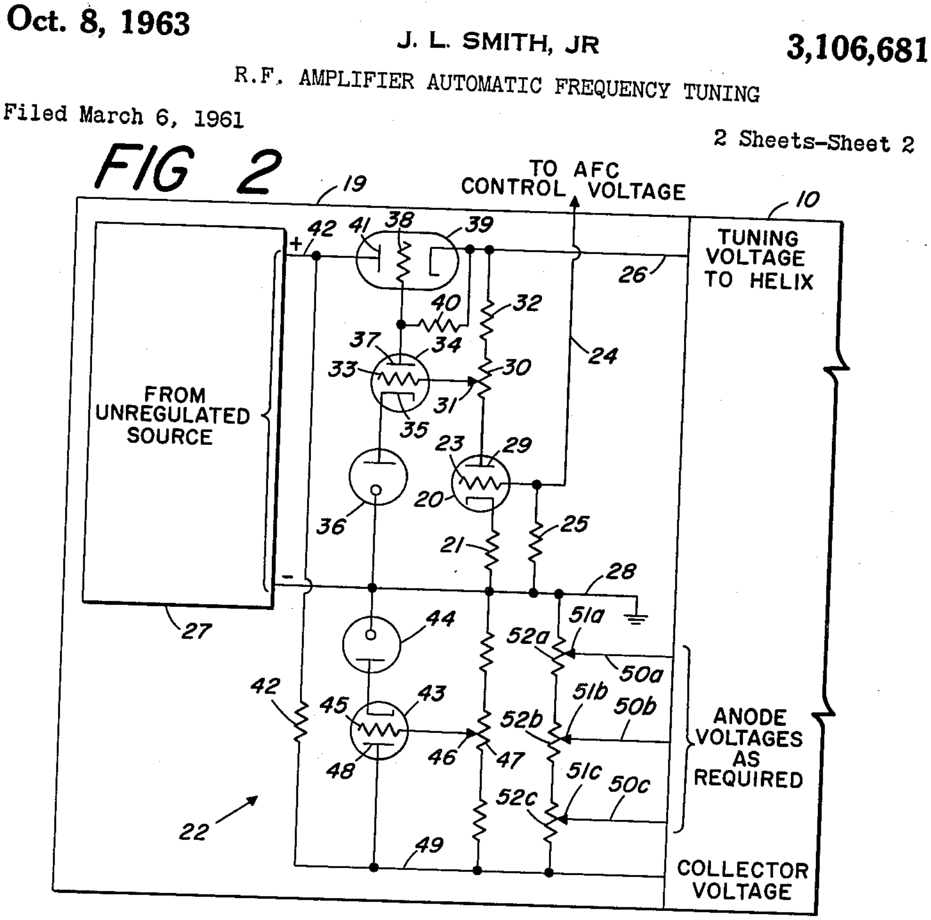
Figure 3:
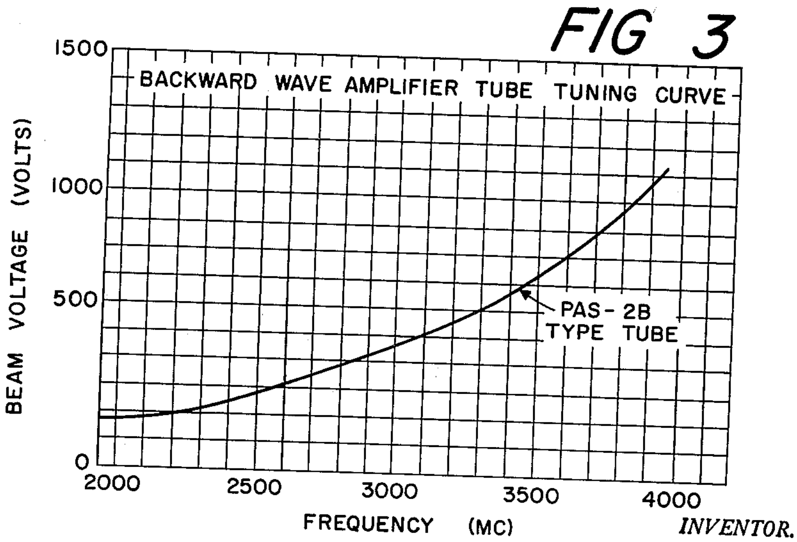

In the drawings:

FIG. 1 represents schematically the tuning system of this invention;

FIG. 2, a schematic of the power supply for a backward wave amplifier tube arranged to provide an automatic frequency control tuning voltage for the helix of the backward wave amplifier tube; and FIG. 3, a graph of frequency vs. the voltage of the beam of a backward wave amplifier tube.

Referring to the drawings:

Radio frequency amplifier 10 is fed an R.F. input from antenna 11 and in turn feeds an output to mixer 12. Local oscillator 13 provides an output which is conveniently fed through power divider 14 to mixer 12. The oscillator signal and the R.F. signal are mixed in the mixer 12, according to established practice, to advantageously provide a normally fixed intermediate frequency, which may be fed through I.F. amplifier-filter 15 to provide an output for use with equipment (not shown). The I.F. signal from amplifier-filter 15 is fed to I.F. discriminator 16. The well known S curve response of discriminator 16 is advantageously utilized in developing a plus or minus D.C. voltage whenever the I.F. shifts from the frequency set as a reference in discriminator 16. The plus or minus D.C. voltage output from discriminator 16 is fed to oscillator 13 to control its frequency in a conventional manner.

The output signal of local oscillator 13 is, in addition to being fed to mixer 12, applied through power divider 14 to oscillator discriminator 17. Discriminator 17 has a normal S curve response and produces an output if the frequency of the signal from the local oscillator varies from a predetermined reference. The output signal from oscillator discriminator 17 is conveniently fed through D.C. amplifier 18 to a tuning control 19 associated with R.F. amplifier 10. The output of tuning control 19 tunes R.F. amplifier 10 in the proper direction and amount as required for accurate tuning.

The manner in which the output of discriminator 17 controls the frequency is to vary the grid potential of a tube in the R.F. amplifier tube's power supply. Tubes such as the Hughes PAS–2B (a backward wave amplifier tube) require a power supply capable of handling a multiplicity of voltages that are connected to the various electrodes of the tubes. One of the output voltages, which is supplied to a frequency controlling electrode, is normally controlled by a wiper contact on a variable resistor. In order to additionally control the output voltage to the frequency controlling grid, a triode tube has been placed in the power supply and its control grid is connected to the output of amplifier 18.

FIGURE 2 illustrates triode tube 20, which has been inserted with a cathode resistor 21 in place of a resistor (not shown) of the otherwise conventional power supply 22. The grid 23 of tube 20 is connected to the output lead 24 of amplifier 18, and grid 23 is also connected to ground through resistor 25. The frequency controlling electrode of the R.F. amplifier tube is attached to tuning voltage line 26. Please refer to the frequency vs. beam voltage curve of FIGURE 3 for voltage control characteristics of a typical backward wave tube with varying voltage fed to the tube through line 26. The curve as shown in nonlinear over the relatively extensive range of frequencies plotted. However, for practical purposes, through the relatively small range of frequency tuning around a predetermined reference frequency the curve may be considered linear without any material problems being presented.

Further examination of FIGURE 2 indicates that power supply 22, which receives power from an unregulated source 27 provides a collector voltage, and anode voltages as required in addition to the tuning voltage for the backward wave amplifier tube. Power supply 22 also has a common ground, as represented by line 28, with the PAS–2B tube as well as with the unregulated source 27. The plate 29 of tube 20 is connected to tuning voltage lead 26 through a resistor 30 having an adjustable tap 31 and resitsor 32. The adjustable tap 31 of resistor 30 is connected to grid 33 of tube 34. Tube 34 is positioned in the power supply with its cathode 35 connected to voltage regulator tube 36 and through the tube 36 to ground 28. The plate 37 of tube 34 is connected directly to the grid 38 of tube 39 and is also connected through resistor 40 to tuning voltage line 26. The plate 44 of tube 39 is connected to line 42 from the unregulated source 27.

When no voltage signal is being applied to grid 23 of tube 20 the top 31 of resistor 30 may be adjusted to provide precise tuning voltage on line 26 for the desired R.F. amplifier tuned frequency. This precise setting may be accomplished by setting tap 31, since tube 20 behaves substantially as a resistor in the voltage dividing circuit comprised of resistor 21, tube 20, resistor 30, and resistor 32. Thereafter, whenever local oscillator 13 shifts from a predetermined reference frequency, oscillator discriminator 17 provides a voltage signal which is fed to grid 23 of tube 20. When this occurs, tube 20 conducts more or less current depending on the direction of the frequency change and the degree of variance from a predetermined reference. With changes in current conduction through tube 20 the voltage level of resistor tap 31 varies to thereby vary the voltage on grid 33 and thereby determine the bias of tube 34. Thus, both the setting of tap 31 and any signal from oscillator discriminator 17 that may be fed to grid 23 of tube 20 determine the bias of tube 34 and the consequent current flow through resistor 40 to line 26. Current flowing through resistor 40 determines the bias applied to grid 38 of tube 39 to thereby control the voltage of the cathode of tube 39, which is applied through line 26 as a tuning voltage to the helix of the backward wave amplifier.

The portion of power supply 22 for supplying collector voltage and anode voltages, shown below the common ground line 28 in FIGURE 2, provides regulation by dropping excess voltage across resistor 42. Tube 43, which is connected through voltage regulator tube 44 to common ground 28 has its grid 45 connected to the center tap 46 of voltage divider resistor 47 and has its plate 48 connected to the collector voltage line 49. Tube 43 is, in effect, a variable resistor which varies as a function of output voltage. Anode voltage lines 50*a*, 50*b*, and 50*c*, for the backward wave amplifier tube, are fed preset voltages from adjustable taps 51*a*, 51*b*, and 51*c* of voltage divider resistors 52*a*, 52*b*, and 52*c*, respectively. Tubes 20, 34, 39, and 43 in power supply 22 are illustrated as being triodes, although pentode and/or tetrode tubes could be used.

In operation, an input R.F. signal $f_s$ is mixed with local oscillator frequency signal $f_o$ to produce an intermediate frequency $f_i$. The local oscillator 13 may operate at a higher or lower frequency than the R.F. signal for mixing to provide I.F. However, for illustrating a typical system consider an R.F. value of 2500 megacycles (mc.) and a local oscillator lower frequency of 2470 mc. With such frequency values $f_i = f_s - f_o = 2500$ mc. $-$ 2470 mc. $=$ 30 mc. which, being a much lower frequency, is more manageable for amplification and for the I.F. discriminator 16. Any R.F. drift in such a system is immediately reflected by a corresponding but opposite shift in oscillator frequency in order that the I.F. will be properly controlled. In addition, since the R.F. amplifier is automatically tuned as a function of $f_o$ (oscillator frequency) and since $f_o$ is a function of $f_s$, the R.F. amplifier is automatically tuned as a function of R.F. drift.

The local oscillator 13 may occasionally be subject to drift. This, however, is quickly sensed by discriminator 16 through the effect of oscillator drift on the I.F. and is immediately compensated for by a discriminator correction voltage for oscillator 13. Hence, oscillator output frequency is a good reference which may be advantageously employed for automatic frequency tuning. Any trace of local oscillator drift appearing at any time is maintained at such low level by quick corrective action in the AFC servo loop as to be an insignificant factor in the signal fed to the oscillator discriminator 17 and not cause error in R.F. amplifier 10 tuning.

In a radio system working in the ultra-high frequency range and above oscillator discriminator 17 may be of the resonant cavity type for use as by example at about 2500 mc. In addition, the local oscillator signal is discriminated instead of the R.F. signal from the R.F. amplifier. If the R.F. signal from the R.F. amplifier were to be discriminated directly expensive amplifying equipment would be required to insure that the R.F. signal would not be weakened or distorted by loading or by transient noise pick-up.

An oscillator discriminator 17 may be equipped with a number of microwave type cavities that could be ganged and preselected if it is necessary that adjustment be made for automatic tuning about different chosen R.F. signals. A single knob selector (not shown) along with driving linkage of a mechanically interconnecting tracking arrangement may be used for selecting preset compatible frequency settings for the R.F. input, for the local oscillator, and for oscillator discriminator reference frequency.

With radio receiving systems receiving R.F. signals below the high frequency range a commercially available Vericap may be used for R.F. tuning control. Tuning voltage would be fed to a Vericap in tuning control 19 for automatically tuning amplifier 10 in following R.F. signal drift.

Whereas this invention is here illustrated and described with respect to a specific embodiment thereof, it should be realized that various changes may be made without departing from the essential contributions to the art made by the teachings hereof.

I claim:

1. In a radio receiving system having a radio frequency amplifier, a local oscillator, a signal mixer, means for feeding a radio frequency input to said amplifier, said amplifier and said oscillator being connected to said mixer for providing a mixer output, a frequency discriminator operatively connected to both said mixer and said oscillator for controlling said oscillator as a function of mixer output; means for automatically tuning said radio frequency amplifier as a function of the radio frequency input, said oscillator comprising a portion of said means for automatically tuning said radio frequency amplifier, and wherein said means for automatically tuning the radio frequency amplifier includes, an oscillator discriminator having an input and an output, the output of said oscillator being connected to the input of said discriminator, tuning control means associated with said radio frequency amplifier, and means for applying the output of said discriminator to said tuning control means.

2. In a radio receiving system having a radio frequency amplifier, a local oscillator, a signal mixer, means for feeding a radio frequency input to said amplifier, said amplifier and said oscillator being connected to said mixer for providing a mixer output, a frequency discriminator operatively connected to both said mixer and said oscillator for controlling said oscillator as a function of mixer output; means for automatically tuning said radio frequency amplifier as a function of the radio frequency input, said oscillator comprising a portion of said means for automatically tuning said radio frequency amplifier, and wherein said means for automatically tuning the radio frequency amplifier includes, an oscillator discriminator having an input and an output, a power supply adapted for supplying a multiplicity of voltages to said radio frequency amplifier and for varying one of the voltages supplied to said amplifier for frequency tuning control, an electron discharge device provided with voltage signal input means in said power supply adapted for controlling the tuning voltage output of the power supply, the input of said discriminator being connected to said local oscillator, and the output of said discriminator being connected to the voltage signal input means of said electron discharge device.

3. The radio receiving system of claim 1, wherein the tuning control means comprises, a power supply adapted for supplying a multiplicity of voltages to said radio frequency amplifier, one of said voltages being a frequency tuning voltage, and a tube in said power supply having an electrode connected to the output of said discriminator for control of the frequency tuning voltage fed to the radio frequency amplifier.

References Cited in the file of this patent

UNITED STATES PATENTS

| | | |
|---|---|---|
| 2,152,336 | Van Loon | Mar. 28, 1939 |
| 2,240,428 | Travis | Apr. 29, 1941 |
| 2,871,349 | Shapiro | Jan. 27, 1959 |
| 2,911,527 | Sontheimer | Nov. 3, 1959 |
| 2,916,619 | Wheeler | Dec. 8, 1959 |
| 2,923,815 | Sontheimer | Feb. 2, 1960 |
| 2,953,637 | Baugh | Sept. 20, 1960 |